(12) United States Patent
Zozgornik

(10) Patent No.: US 10,598,327 B2
(45) Date of Patent: Mar. 24, 2020

(54) LASER-BASED LIGHT SOURCE

(71) Applicant: Lumileds LLC, San Jose, CA (US)

(72) Inventor: Steffen Zozgornik, Leverkusen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/096,594

(22) PCT Filed: Apr. 18, 2017

(86) PCT No.: PCT/EP2017/059159
§ 371 (c)(1),
(2) Date: Oct. 25, 2018

(87) PCT Pub. No.: WO2017/186529
PCT Pub. Date: Nov. 2, 2017

(65) Prior Publication Data
US 2019/0137064 A1 May 9, 2019

(30) Foreign Application Priority Data

Apr. 27, 2016 (EP) ..................................... 16167327

(51) Int. Cl.
| | |
|---|---|
| *F21S 41/176* | (2018.01) |
| *F21S 41/16* | (2018.01) |
| *F21S 41/24* | (2018.01) |
| *G02B 6/42* | (2006.01) |
| *F21K 9/64* | (2016.01) |
| *F21V 8/00* | (2006.01) |
| *H01S 5/00* | (2006.01) |

(Continued)

(52) U.S. Cl.
CPC .............. *F21S 41/176* (2018.01); *F21K 9/64* (2016.08); *F21S 41/16* (2018.01); *F21S 41/24* (2018.01); *F21S 45/70* (2018.01); *G02B 6/4286* (2013.01); *H01S 5/06825* (2013.01); *F21V 2200/10* (2015.01); *G02B 6/0008* (2013.01); *H01S 5/005* (2013.01); *H01S 5/02284* (2013.01); *H01S 5/0683* (2013.01)

(58) Field of Classification Search
None
See application file for complete search history.

(56) References Cited

U.S. PATENT DOCUMENTS

| | | |
|---|---|---|
| 3,253,500 A | 5/1966 | Hicks, Jr. |
| 2009/0296018 A1 | 12/2009 | Harle et al. |

(Continued)

FOREIGN PATENT DOCUMENTS

DE 10213207841 A1 10/2014

*Primary Examiner* — Ashok Patel
(74) *Attorney, Agent, or Firm* — Volpe and Koenig, P.C.

(57) ABSTRACT

A laser-based light source comprises a laser, an optical fiber, a conversion device, and a detector, the laser for emitting laser light with a laser peak emission wavelength, the optical fiber for guiding the laser light for being received at a first surface of the conversion device, the conversion device for converting at least a part of the laser light to converted light with a peak emission wavelength being longer than the laser peak emission wavelength, the optical fiber further for guiding a part of the converted light back in the direction of the laser and the detector for detecting at least a part of the back guided converted light. A vehicle headlight comprises such a laser-based light source, and a lighting system comprises such a vehicle headlight.

15 Claims, 4 Drawing Sheets

(51) Int. Cl.
*H01S 5/022* (2006.01)
*F21S 45/70* (2018.01)
*H01S 5/068* (2006.01)
*H01S 5/0683* (2006.01)

(56) References Cited

U.S. PATENT DOCUMENTS

2014/0015413 A1* 1/2014 Ito .................... G02B 6/4286
  315/119
2015/0292699 A1 10/2015 Wolfing et al.
2016/0245471 A1* 8/2016 Nakazato ................ F21S 41/14

* cited by examiner

LASER-BASED LIGHT SOURCE

FIELD OF THE INVENTION

The invention relates to a laser-based light source, a vehicle headlight comprising such a laser-based light source and a lighting system comprising at least one such vehicle headlight.

BACKGROUND OF THE INVENTION

In high luminance light sources often a phosphor is used as a converter being excited by blue light emitted by a laser. For measurement and control of the emitted light the converter head could be equipped with sensors or detectors. The feedback signals of the detector or sensors are used to control the laser. Eye-safety of such laser-based light sources has to be guaranteed even in case of a malfunction. Furthermore, the physical form factor of the laser based-light source should be flexible in order to increase freedom of design of, for example, a vehicle headlight comprising such laser based-light source.

US20090296018A1, DE102013207841A1, and DE102013207841A1 proposed various methods for monitoring the function of the converter as well as of a light guide used for transporting the excitation radiation to the converter. In particular, it was proposed to realize the light guide either as a bundle of optical fibers or as a structure of branched light paths where one fiber or light path then can be used for back guiding part of the converted light to a monitoring detector whereas the other fibers or light paths then serve for forward guiding the excitation radiation to the converter. Due to using several fibers or branching structures, unfortunately, these systems are complex and costly.

SUMMARY OF THE INVENTION

It is an object of the present invention to provide a laser-based light source, especially a laser-based headlight, with improved eye-safety and flexible physical form factor.

According to a first aspect a laser-based light source is provided. The laser-based light source comprises at least one laser, at least one optical fiber, at least one conversion device and at least one detector. The at least one laser is adapted to emit laser light with a laser peak emission wavelength. The at least one optical fiber is adapted to guide the laser light such that the laser light is received at a first surface of the at least one conversion device. The conversion device is adapted to convert at least a part of the laser light to converted light. A peak emission wavelength of the converted light is in a longer wavelength range than the wavelength range of the laser peak emission wavelength of the emitted laser light. The at least one optical fiber is further adapted to guide a part of the converted light back in the direction of the at least one laser. The detector is arranged to detect at least a part of the back guided converted light.

Decoupling of the laser and the conversion device by means of the optical fiber may increase the flexibility with respect to the design of the laser-based light source and especially of light sources such as vehicle headlights. The laser with electrical driver (the latter may be comprised by a controller or combined with a controller) can be placed at a different place than the conversion device. Control of the laser by means of the controller or electrical driver is at least partly enabled by means of the detector. Detector signals may be generated in reaction to the detected part of the back guided converted light which may be used for closed loop control of the laser-based light source by means of the controller and/or electrical driver.

The guided laser light and the back guided converted light are transmitted via the same optical fiber. No extra optical or electrical connection between the laser and the conversion device is needed in order to transfer a part of the converted light to the detector or to transfer a detector signal generated by means of an alternative detector arranged next to the conversion device to the controller and/or electrical driver arranged next to the laser. The decreased number of signal lines further increases the flexibility of the laser based light source. The detector may further be used to detect malfunction of the optical fiber or the conversion device. The laser may be switched off as soon as an intensity of the detected back guided converted light is that low that, for example, this may be taken as an indication for a breakage of the optical fiber or for a displacement or removal of the conversion device.

The laser-based light source may be arranged such that essentially no light in a defined wavelength range around the laser peak emission wavelength is received by the side of the optical fiber which is next to the conversion device or the conversion module. The detection of the converted light may be simplified if essentially no laser light is back guided by means of the optical fiber.

The conversion device may be arranged to convert essentially the entire laser light received at the first surface of the conversion device. An additional blue light source like an additional laser and corresponding optical devices (e.g. light guides, lenses, scattering devices and the like) without converter may be used in this case to emit sufficient blue light to get mixed light which comprises the converted light and additional blue light with a predefined color point as e.g. a predefined white point.

The conversion device may be alternatively arranged such that at least a part of the laser light is not converted but e.g. reflected. A mixture of the converted light and the laser light which has not been converted may in this case be used to generate white light with a predefined color point.

The detector may be arranged such that detection of back guided laser light, especially back guided reflected laser light, is reduced or even avoided. The detector may for example be arranged at an angle with respect to the optical axis of the optical fiber such that less or nearly no back guided laser light is detected. The intensity and angular distribution of back guided laser light may, for example, be influenced by means of a reflection characteristic of the conversion device reflecting the laser light. Alternatively or in addition, a filter may be arranged in front of the detector such that light at and around the laser peak emission wavelength is filtered and preferably only converted light is transmitted. Furthermore, optical devices like lenses, apertures and the like may be used to influence an angular distribution of the back guided converted light and an angular distribution of the back guided laser light.

The laser-based light source may comprise two, three, four or more detectors. The laser based light source may further comprise an additional detector to detect back guided laser light optionally with a filter or the like to suppress detection of back guided converted light.

The laser-based light source may comprise two, three, four or more lasers like an array of lasers emitting laser light which is guided by means of one optical fiber. Alternatively, the laser-based light source may comprise two, three, four or more lasers like an array of lasers and one optical fiber for each laser and optionally one detector for each optical fiber.

The conversion device may comprise a conversion element, a mounting structure, a heat sink and optionally a reflective structure. The conversion element may comprise a phosphor for converting, for example, at least a part of blue laser light to yellow converted light. The phosphor may, for example, be a ceramic block of Cerium doped Yttrium-Aluminum-Garnet (YAG). One of the surfaces of the ceramic block may be the first surface of the conversion device.

The at least one optical fiber may comprise at least a first guiding structure with a first numerical aperture and at least a second guiding structure with a second numerical aperture with respect to an optical axis of the at least one optical fiber. The detector may be arranged to receive the part of the back guided converted light which is received by the at least one optical fiber from the conversion device at an angle with respect to the optical axis which is bigger than a first boundary angle with respect to the optical axis which is defined by the smaller of the first numerical aperture and the second numerical aperture.

The detector may, for example, be placed such that converted light is received in a range of angles between the first boundary angle and a second boundary angle defined by the bigger of the first numerical aperture and the second numerical aperture. The shape of the different regions of the optical fiber with different numerical apertures determines the shape of the laser beam on the conversion device but also from what region of the conversion device the back guided converted light is detected and also the angular distribution of back guided reflected laser light. The choice of the detection position of the detector may therefore be used in order to increase contrast between back guided converted light to be detected and, for example, disturbing back guided laser light.

The detector may be arranged to receive the part of the back guided converted light which is received by the at least one optical fiber from the conversion device at an angle with respect to the optical axis which is bigger than the second boundary angle with respect to the optical axis which is defined by the bigger of the first numerical aperture and the second numerical aperture.

The optical fiber may in this case be arranged such that converted light received at an angle with respect to the optical axis of the optical fiber which is bigger than the second boundary angle defined by the bigger numerical aperture is back guided to the detector.

The optical fiber may, for example, be an optical fiber comprising, besides a core, two, three, four or more claddings with different refractive indices which are arranged such that back guided converted light can be detected in a range of angles between the first boundary angle defined by the smaller numerical aperture and the second boundary angle defined by the bigger numerical aperture and even in a range of angles with respect to an optical axis of the optical fiber larger than the second boundary angle defined by the bigger numerical aperture. The number of claddings determines the maximum number of different numerical apertures which can be used.

The at least one optical fiber may, for example, be a double cladded optical fiber. The first guiding structure is a core of the double cladded optical fiber. The second guiding structure is an inner cladding of the double cladded optical fiber. The double cladded optical fiber further comprises an outer cladding.

The different numerical apertures may, for example, be manufactured by a different doping of quartz glass. The double cladded optical fiber may allow to at least partly decouple the laser light and the back guided converted light.

The first refractive index of the core may be bigger than a second refractive index of the inner cladding. The second refractive index of the inner cladding may be bigger than a third refractive index of the outer cladding.

The first numerical aperture of the core may be smaller than the second numerical aperture of the inner cladding.

A difference between the square of the refractive index of the core and the square of the refractive index of the inner cladding may in this case be smaller than a difference between the square of the refractive index of the inner cladding and the square of the refractive index of the outer cladding.

The laser-based light source may preferably be arranged in this case such that the laser light is received by the core within a first range of angles smaller than the first boundary angle defined by the first numerical aperture such that the laser light is guided to the conversion device within the core. The laser-based light source may be further arranged such that a part of the converted light is received by the core or the inner cladding within a second range of angles bigger than the first boundary angle such that the part of the converted light is back guided to the detector within the core and the inner cladding. The detector is arranged to receive the part of the back guided converted light at an angle with respect to the optical axis which is bigger than the first boundary angle.

The laser-based light source may be arranged such that the part of the converted light is received by the core within a second range of angles such that the converted light is back guided to the detector within the core and the inner cladding. The second range of angles is bigger than the second boundary angle defined by the second numerical aperture. The detector is arranged to receive the part of the back guided converted light at an angle with respect to the optical axis which is bigger than the second boundary angle and smaller than a maximum angle defined by the first refractive index of the core and the third refractive index of the outer cladding.

The combination of the core and inner cladding defines a maximum numerical aperture which is proportional to the square root of the difference between the square of the first numerical aperture of the core and the square of the third numerical aperture of the outer cladding. The maximum angle is defined by the maximum numerical aperture. Only light received by the core in the second range of angles is guided by means of the double cladded optical fiber. The detector which is arranged to receive the part of the back guided converted light at an angle with respect to the optical axis which is bigger than the second boundary angle and smaller than the maximum angle detects an image of the core surface in the direction of the conversion device.

The laser-based light source may comprise a first optical device and a second optical device. The first optical device may be arranged to focus the laser light to the core such that the laser light is received by the core within the first range of angles. The second optical device may be arranged such that at least a part of the converted light is focused to the core or the inner cladding such that the part of the converted light is received by the core or the inner cladding at an angle which is bigger than the second boundary angle.

The first and the second optical device may each comprise one, two, three or more optical elements like lenses, apertures or the like. The first and the second optical device may be used to improve an angular separation of the laser light, converted light and optionally laser light coming back from the conversion device. The laser and the first optical device may be preferably arranged such that essentially all laser light passing the first optical device is only received by the core. The first optical device may, for example, comprise a lens in order to focus the laser light to the core or a combination of an aperture and a lens. The second optical device may, for example, be adapted such that a predefined part of the converted light is focused under a predefined angle on the core or the inner cladding.

The first numerical aperture of the core may according to an alternative embodiment be bigger than the second numerical aperture of the inner cladding.

The difference between the square of the refractive index of the core and the square of the refractive index of the inner cladding may in this case be bigger than a difference between the square of the refractive index of the inner cladding and the square of the refractive index of the outer cladding. Converted light may be received by the core under an angle smaller than the boundary angle defined by the bigger numerical aperture of the core. The core is in this case used to transport the back guided converted light. A region of the conversion device which is detected by the detector by means of the back guided converted light is in this case a small part of an excited area of the conversion device. A first optical device and a second optical device may be used to support definition of the area of the conversion device which is detected by means of the back guided converted light. Furthermore, the shape of the core, the inner cladding, and the outer cladding may be adapted in order to improve detection of the back guided converted light as described above. In addition the angle with respect to the optical axis of the optical fiber in which the detector receives the back guided converted light may be in a range of angles which is bigger than the boundary angle defined by the bigger numerical aperture of the core as long as the angle of detection is smaller than the maximum angle defined by the refractive index of the core and the refractive index of the outer cladding.

The laser-based light source may comprise at least one controller arranged to receive detector signals from the detector. The at least one controller may be arranged to provide control signals to control the at least one laser based on the received detector signals.

At least a part of the control of the laser-based light source may be performed by an integrated controller which may comprise an electrical driver for driving the laser. The controller may further be arranged to receive external control signals in order to adapt light emission of the laser-based light source based on the received detector signals and in addition based on the external control signals which may be generated by means of further external sensors.

The controller or even the electrical driver may in an alternative approach be arranged outside the laser-based light source. The electrical driver and the controller may, for example be arranged to control and drive 2, 3, 4 or more laser-based light sources.

The at least one controller may alternatively or in addition be arranged to switch off the at least one laser if an intensity of the back guided converted light measured by the detector is below a predetermined threshold value.

The laser or lasers may be switched off by means of an internal or external controller as described above.

The at least one controller may be further arranged to receive first detector signals from a first detector wherein the first detector is associated to a first laser. The at least one controller may be arranged to provide first control signals to control the first laser based on the received first detector signals.

The total light output of the laser-based light source comprising two, three, four or more lasers may be controlled by taking into account detector signals from one laser for the adaption of the light output of the other lasers.

According to a further aspect a vehicle headlight is provided. The vehicle headlight comprises at least one laser-based light source as described above. The vehicle headlight may comprise two, three, four or more laser-based light sources as described above.

According to a further aspect a lighting system is provided. The lighting system comprises at least one vehicle headlight as described above in case of e.g. a motorbike and at least two vehicle headlights in case of e.g. a car, and at least one light emission control device. The light emission control device may be adapted to submit control signals to the laser-based light source or sources.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a first embodiment of a laser-based light source;

FIG. 2 shows a principal sketch of a second embodiment of a laser-based light source;

FIG. 3 shows a principal sketch of a cross-section parallel to an optical axis of a first optical fiber;

FIG. 4 shows a principal sketch of a cross-section perpendicular to the optical axis of the first optical fiber;

FIG. 5 shows a principal sketch of a cross-section parallel to an optical axis of a second optical fiber;

FIG. 6 shows a principal sketch of a cross-section perpendicular to the optical axis of the second optical fiber.

In the Figures, like numbers refer to like objects throughout. Objects in the Figures are not necessarily drawn to scale.

DETAILED DESCRIPTION OF EMBODIMENTS

Various embodiments of the invention will now be described by means of the Figures.

Figure 1:
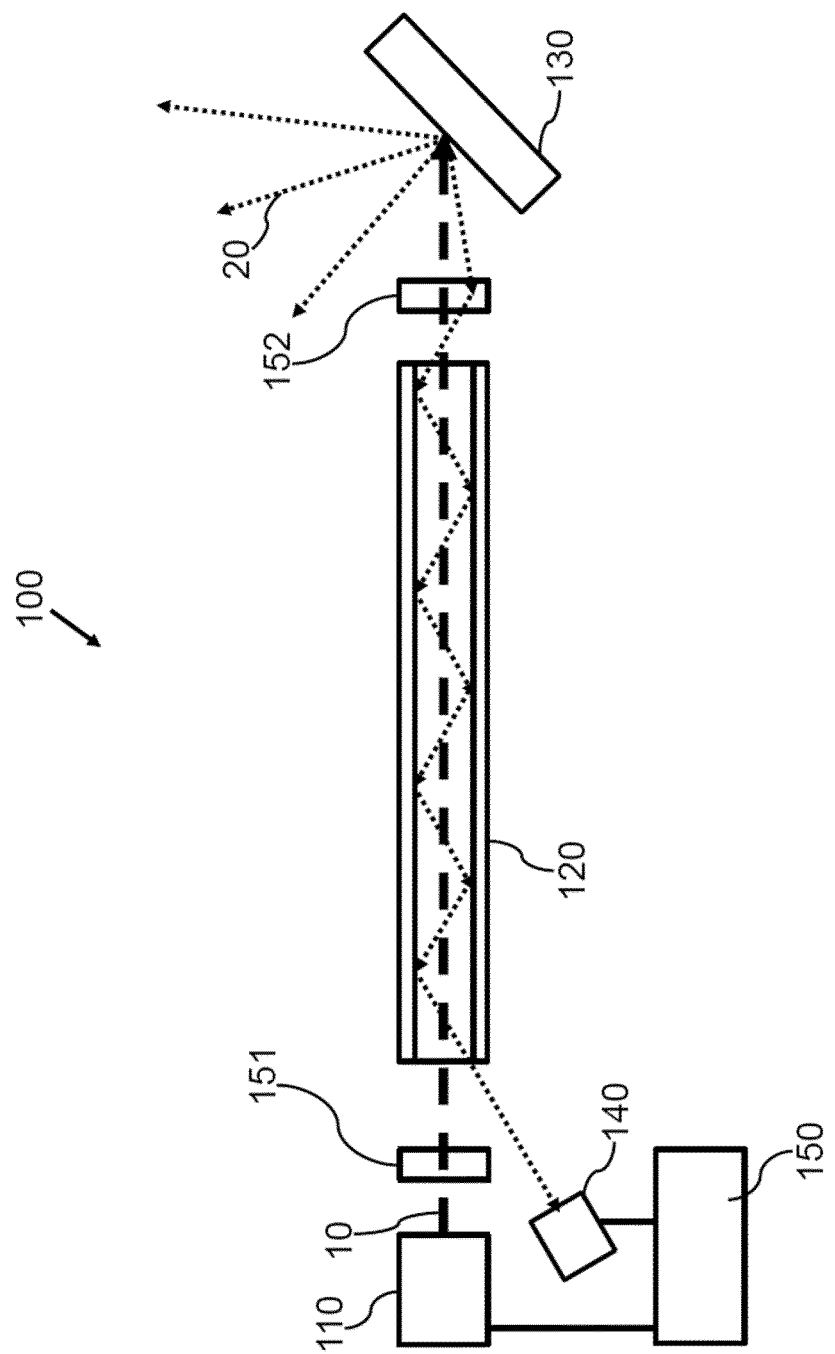

FIG. 1 shows a principal sketch of a first embodiment of a laser-based light source 100. The laser-based light source 100 comprises a laser 110 which is arranged to emit laser light 10. The laser 110 is controlled by means of a controller 150 which comprises an electrical driver to drive the laser 110. The controller 150 receives detector signals from detector 140 which is arranged to detect light which is back guided by means of optical fiber 120. Laser light 10 is focused by means of a first optical device 151 which is in this case a lens to an entrance facet of the optical fiber 120. The entrance facet of the optical fiber 120 may be arranged to avoid reflection of the laser light 10. The laser 110, the first optical device 151, the controller 150 and the detector 140 are arranged on the same side of the optical fiber 120 and may be regarded as a laser module. The laser module may comprise an interface (not shown) to permanently or detachably couple the optical fiber 120 to the laser module. The optical fiber 120 is a single cladded optical fiber which is arranged to guide the laser light 10 to a conversion device 130. The optical fiber 120 is further arranged to back guide light received from the side of the conversion device 130 to the side of the laser 110 or more general of the laser module such that a feedback signal can be generated by means of back guided light received by detector 140.

Laser light 10 guided by optical fiber 120 is focused by means of a second optical device 152, e.g. a lens, to a first surface of the conversion device 130. The conversion device 130 comprises light converting material like a phosphor which is arranged to convert laser light 10 to converted light 20 which has a different wavelength or has a wavelength within a different, especially a longer, wavelength range than the wavelength of laser light 10. The peak wavelength of the laser light 10 is preferably within the blue wavelength range and a peak wavelength of the converted light 20 is preferably within the yellow wavelength range of the visible spectrum. The conversion device 130 is further arranged such that essentially all of the laser light 10 received by the conversion device 130 is converted by means of the light converting material to converted light 20. The angular distribution of the converted light 20 may be influenced by means of a surface structure of a light emission surface of the conversion device 130. The light emission surface may be identical to the first surface to which the laser light 10 is focused. The conversion device 130 and the second optical device 152 may be regarded as a conversion module which can be permanently or detachably coupled to optical fiber 120 by means of an accordingly adapted interface (not shown). A part of the converted light 20 is focused by means of the second optical device 152 to an exit facet (with respect to laser light 10) of the optical fiber 120. A part of the converted light 20 is back guided by means of optical fiber 120. The detector 140 in the laser module is arranged such that a part of the back guided converted light 20 is detected.

Figure 2:
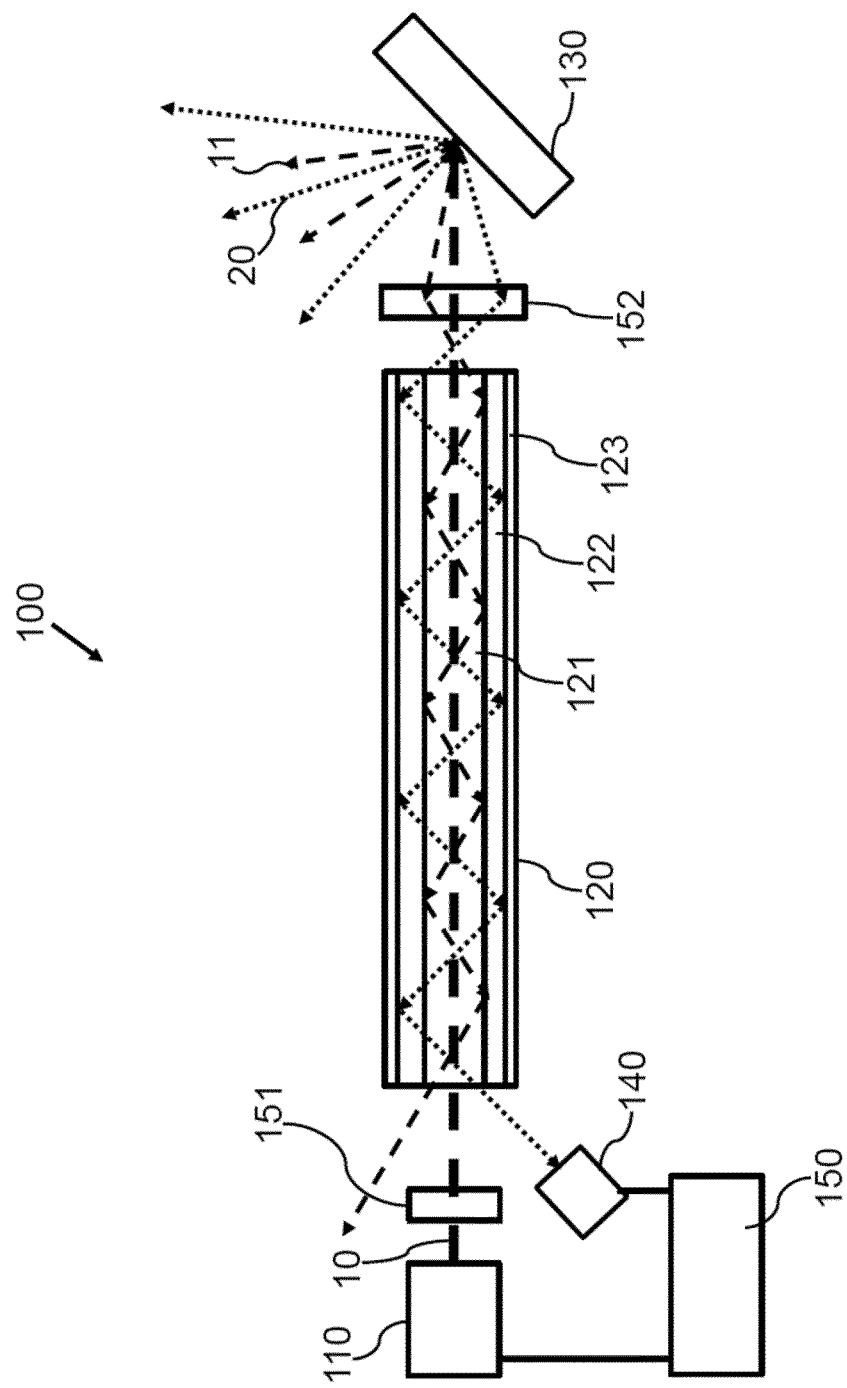

FIG. 2 shows a principal sketch of a second embodiment of a laser-based light source 100. The configuration is very similar to the first embodiment discussed with respect to FIG. 1. The single cladded optical fiber 120 is replaced by a double cladded optical fiber which comprises a core 121 with a first refractive index n1, an inner cladding 122 with a second reflective index n2<n1, and an outer cladding 123 with a third reflective index n3<n2. A main difference is that a part of the laser light 10 is reflected at the first surface of the conversion device 130. This reflected laser light 11 is also received by the exit facet of the optical fiber 120 such that a part of the reflected laser light 11 is back guided by the optical fiber 120, too. A ratio between the back guided converted light 20 and back guided reflected light 11 may be influenced by means of the angular distribution of the converted light 20 and the reflected light 11 or by, for example, separating the first surface which reflects a part of the laser light 10 and the light emission surface by, for example, providing a reflective coating at this first surface which is arranged to reflect converted light 20 and extract the converted light 20 at a different surface of the phosphor. Converted light 20 and reflected laser light 11 may in this case be mixed by an accordingly adapted optical mixer which may be comprised by the laser-based light source 100 or which may be arranged externally. The double cladded optical fiber enables an at least partial decoupling between converted light 20 and reflected laser light 11.

Figure 3:
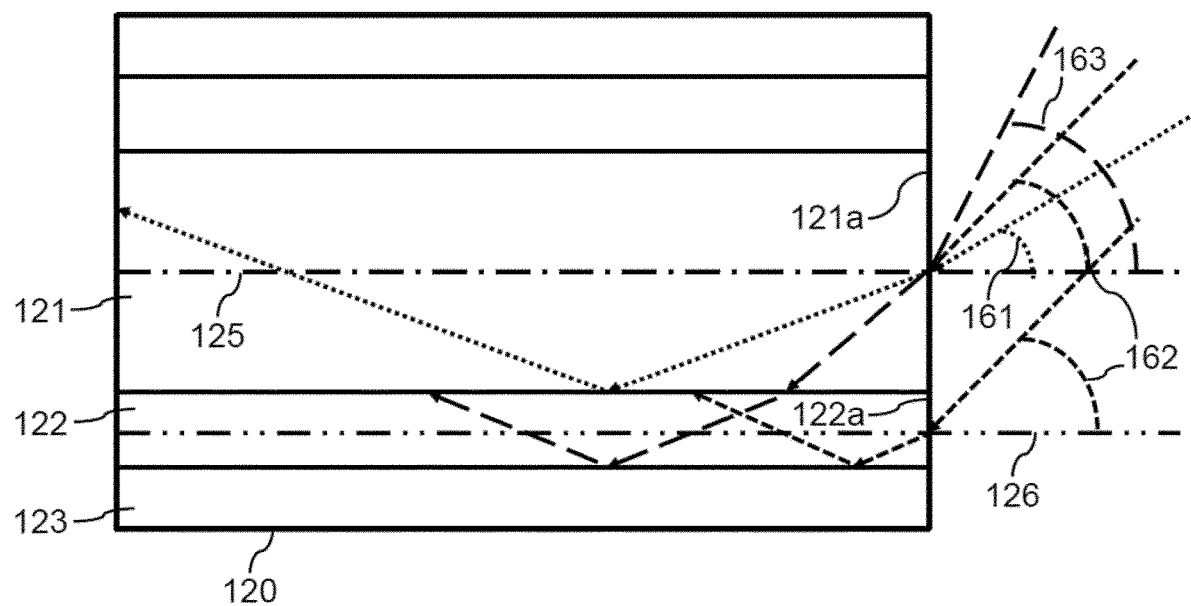

FIG. 3 shows a principal sketch of a cross-section parallel to an optical axis 125 of a first optical fiber 120 which is configured as a double cladded optical fiber as shown in FIG. 2. The double cladded optical fiber is arranged such that the numerical aperture NAc of the core which is defined as $NAc=\sqrt{n1^2 n2^2}$ is smaller than the numerical aperture NAic of the inner cladding which is defined $NAic=\sqrt{n2^2 n3^2}$. Light received at the light entrance surface of the core 121 with an angle of incidence between the optical axis 125 and the first boundary angle 161 which is defined by NAc is guided within the core 121. Light received at the light entrance surface of the core 121a (with respect to light coming from the conversion device 130) with an angle of incidence between the optical axis 125 and the maximum angle 163 which is determined by the maximum numerical aperture NAmax of the double cladded optical fiber which is defined as $NAmax=\sqrt{n1^2 n3^2}$ is guided within the inner cladding 122. Light received by a light entrance surface of the inner cladding 122a (with respect to light coming from the conversion device 130) at an angle of incidence smaller than the second boundary angle 162 which is defined by NAic is guided within the inner cladding 122. Light received at the light entrance surface of the core 121a at an angle bigger than the maximum angle 163 or received at the light entrance surface of the inner cladding 122a at an angle bigger than the second boundary angle 162 with respect to an inner cladding's axis 126 parallel to optical axis 125 will be absorbed after entering the outer cladding 123.

The double cladded optical fiber can be used to at least partially decouple the back guiding of the converted light 20 and the reflected laser light 11 for bigger angles than the first boundary angle 161. The inner cladding 122 may be further arranged such that reflected laser light 11, as e.g. blue laser light, (but not the converted light 20) is absorbed in order to reduce the intensity of back guided reflected laser light 11 received at bigger angles than the first boundary angle 161. Alternatively or in addition, filters or absorbers for the blue laser light may be arranged on a part of the facets of the double cladded optical fiber on the side of the conversion device and especially on the side of the laser in order to avoid or reduce back guiding of reflected laser light 11 at bigger angles than the first boundary angle 161.

Figure 4:
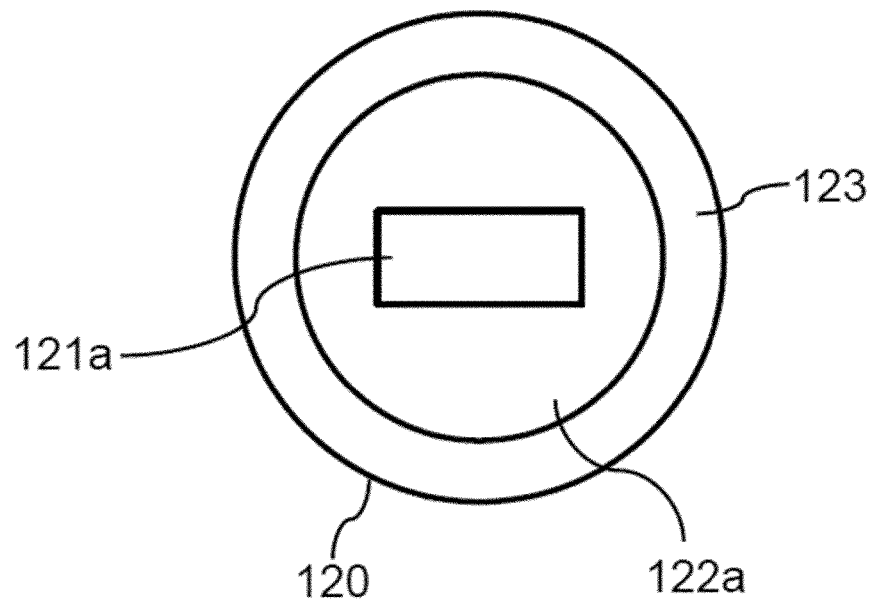

FIG. 4 shows a principal sketch of a cross-section perpendicular to the optical axis 125 of the first optical fiber 120 as discussed with respect to FIG. 3. The light entrance surface of the core 121a with the smaller numerical aperture NAc has in this case a rectangular shape wherein the light entrance surface of the inner cladding 122a surrounding the light entrance surface of the core 121a has a circular outer boundary to the outer cladding 123. The rectangular shape of the core 121 is used to define in combination with the second optical device a predefined illumination pattern on the conversion device 130 and especially the conversion material (phosphor) comprised by the conversion device 130. The core 121 (low NA region) which is used for transporting the laser light 10 (blue laser light) emitted by the laser 110 is placed inside the high NA region of the inner cladding 122. The region of the conversion device 130, or more precisely the conversion material comprised by the conversion device 130, that is detected by detector 140 is larger than the area excited by means of laser light 10 guided in the core 121. If the detector 140 is detecting under an angle larger than the second boundary angle 162 but smaller than the maximum angle 163 an image of the light entrance surface of the core 121a is detected.

Figure 5:
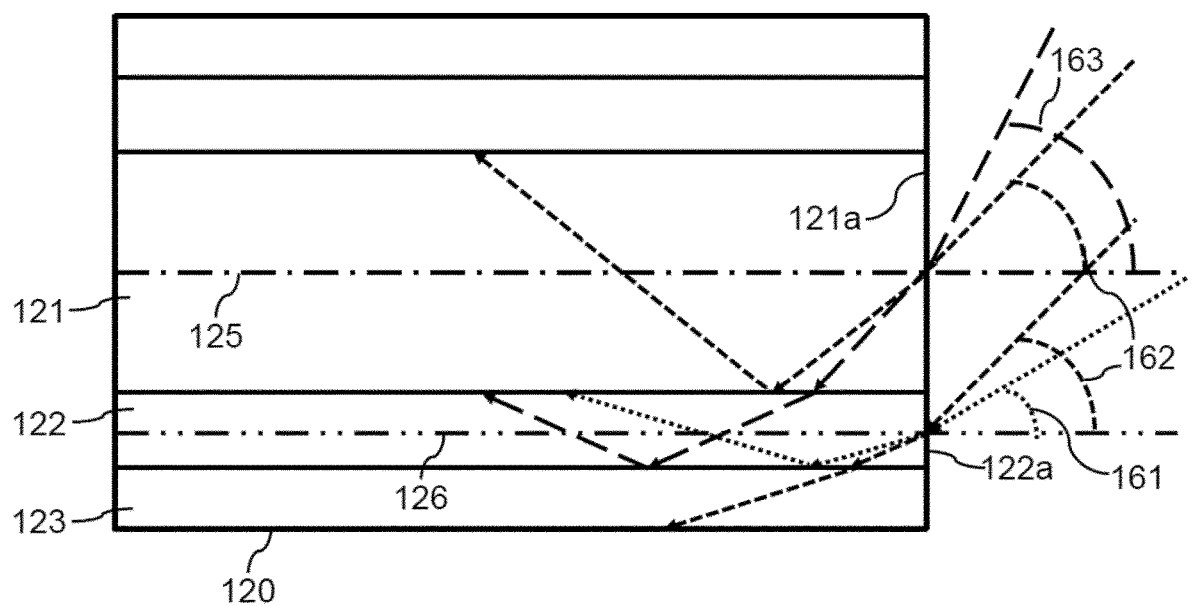

FIG. 5 shows a principal sketch of a cross-section parallel to an optical axis 125 of a second optical fiber 120 which is configured as a double cladded optical fiber as shown in FIG. 2. The general configuration is quite similar as discussed with respect to FIG. 3, but the numerical aperture NAc of the core 121 is bigger than the numerical aperture NAic of the inner cladding 122. The double cladded optical fiber is arranged such that the numerical aperture NAc of the core 121 is bigger than the numerical aperture NAic of the inner cladding 122. Light received at the light entrance surface of the core 121a with an angle of incidence between the optical axis 125 and the second boundary angle 162 is guided within the core 121. Light received at the light entrance surface of the core 121a with an angle of incidence between the optical axis 125 and the maximum angle 163 is guided within the inner cladding 122. Light received by a light entrance surface of the inner cladding 122a at an angle of incidence smaller than the first boundary angle 161 is guided within the inner cladding 122. Light received at the light entrance surface of the core 121a at an angle bigger than the maximum angle 163 or received at the light entrance surface of the inner cladding 122a at an angle bigger than the first boundary angle 161, which is in this case smaller than the second boundary angle 162, will be absorbed after entering the outer cladding 123.

Figure 6:
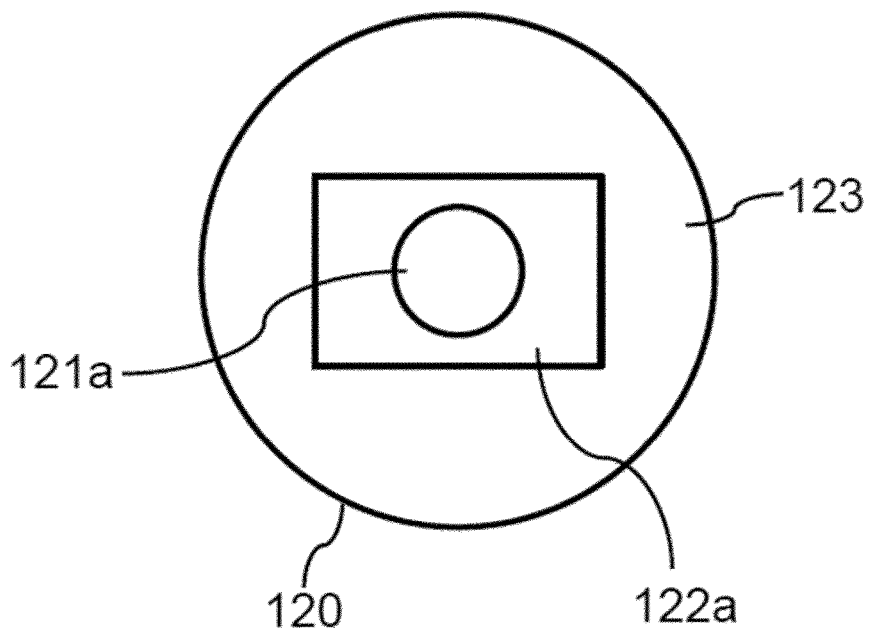

FIG. 6 shows a principal sketch of a cross-section perpendicular to the optical axis 125 of the second optical fiber 120 as discussed with respect to FIG. 5. The light entrance surface of the core 121a with the bigger numerical aperture NAc has in this case a circular shape wherein the light entrance surface of the inner cladding 122a surrounding the light entrance surface of the core 121a has a rectangular outer boundary to the outer cladding 123. The core 121 (high NA region) which is used for transporting the laser light 10 (blue laser light) is placed inside the low NA region of the inner cladding 122. The region of the conversion device 130, or more precisely the conversion material comprised by the conversion device 130, that is detected by detector 140 is in this case a small part of the area of the conversion material excited by means of laser light 10. If the detector 140 is detecting under an angle larger than the second boundary angle 162 but smaller than the maximum angle 163 an image of the light entrance surface of the core 121a is detected which receives only converted light 20 from the excited area of the conversion material. The configuration of the optical fiber 120 may therefore be used in order to define the detection area on the conversion material of the conversion device 130.

It is a basic idea of the present invention to use only one optical fiber 120 to guide laser light 10 emitted by a laser 110 to a conversion device 130 and converted light 20 which is converted by means of the conversion device 130 back in the direction of the laser 110. Extensive wiring is thus avoided by using only one optical fiber 120 instead of two optical fibers or one optical fiber in combination with an electrical signal line which may be used to transfer detector signals back to a controller 150 in order to control the laser 110. Furthermore, a malfunction like a break of the optical fiber 120 emitting the laser light 10 or a displacement of the conversion device 130 can be detected by means of a detector 140, e.g. a photo diode or the like, arranged at the side of the laser 110 if the back guided converted light 20 falls below a predefined threshold value. Detection of back guided converted light 20 may be improved by using a double cladded or even multi cladded optical fiber 120 (three, four or more claddings). Different numerical apertures of the core and of at least one cladding, e.g. of the inner cladding, may be used in order to decouple the angular distribution of the laser light from the one of the back guided converted light 20, and, optionally, from the one of the back guided laser light 10, i.e., e.g. of the one of the reflected laser light 11.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 laser light
11 reflected laser light
20 converted light
100 laser-based light source
110 (first) laser
120 optical fiber
121 core
121a light entrance surface of core
122 inner cladding
122a light entrance surface of inner cladding
123 outer cladding
125 optical axis of optical fiber
126 inner cladding's axis
130 conversion device
140 detector
150 controller
151 first optical device
152 second optical device
161 first boundary angle
162 second boundary angle
163 maximum angle

The invention claimed is:

1. A laser-based light source comprising at least one laser, at least one optical fiber, at least one conversion device and at least one detector, wherein the at least one laser is adapted to emit laser light with a laser peak emission wavelength, wherein the at least one optical fiber is adapted to guide the laser light such that the laser light is received at a first surface of the at least one conversion device, wherein the conversion device is adapted to convert at least a part of the laser light to converted light, wherein a peak emission wavelength of the converted light is in a longer wavelength range than the laser peak emission wavelength, wherein the at least one optical fiber is further adapted to receive from the conversion device and to guide back in the direction of the at least one laser a part of the converted light, and wherein the detector is arranged to detect at least a part of the back guided converted light.

2. The laser-based light source according to claim 1, wherein the at least one optical fiber comprises at least a first light guiding structure with a first numerical aperture and at least a second light guiding structure with a second numerical aperture with respect to an optical axis of the at least one optical fiber, and wherein the detector is arranged to receive the part of the back guided converted light which is received by the at least one optical fiber from the conversion device at an angle with respect to the optical axis which is bigger than a first boundary angle with respect to the optical axis, wherein the first boundary angle is defined by the smaller of the first numerical aperture and the second numerical aperture.

3. The laser-based light source according to claim 2, wherein the detector is arranged to receive the part of the back guided converted light which is received by the at least one optical fiber from the conversion device at an angle with respect to the optical axis which is bigger than a second boundary angle with respect to the optical axis, wherein the second boundary angle is defined by the bigger of the first numerical aperture and the second numerical aperture.

4. The laser-based light source according to claim 2, wherein the at least one optical fiber is a double cladded optical fiber, wherein the first light guiding structure is a core of the double cladded optical fiber, wherein the second light guiding structure is an inner cladding of the double cladded optical fiber and wherein the double cladded optical fiber further comprises an outer cladding.

5. The laser-based light source according to claim 4, wherein a first refractive index of the core is bigger than a second refractive index of the inner cladding, and wherein the second refractive index of the inner cladding is bigger than a third refractive index of the outer cladding.

6. The laser-based light source according to claim 5, wherein the first numerical aperture of the core is smaller than the second numerical aperture of the inner cladding.

7. The laser-based light source according to claim 6, wherein the laser-based light source is arranged such that the laser light is received by the core within a first range of angles smaller than the first boundary angle defined by the first numerical aperture such that the laser light is guided to the conversion device within the core, and wherein the laser-based light source is arranged such that a part of the converted light is received by the core or the inner cladding within a second range of angles bigger than the first boundary angle such that this part of the converted light is back guided to the detector within the core and the inner cladding, and wherein the detector is arranged to receive this part of the back guided converted light at an angle with respect to the optical axis which is bigger than the first boundary angle.

8. The laser-based light source according to claim 7, wherein the laser-based light source is arranged such that a part of the converted light is received by the core or the inner cladding within a third range of angles such that this part of the converted light is back guided to the detector within the core and the inner cladding, wherein the third range of angles is bigger than a second boundary angle defined by the second numerical aperture and wherein the detector is arranged to receive this part of the back guided converted light at an angle with respect to the optical axis which is bigger than the second boundary angle and smaller than a maximum angle defined by the first refractive index of the core and the third refractive index of the outer cladding.

9. The laser-based light source according to claim 7, wherein the laser-based light source comprises a first optical device and a second optical device, wherein the first optical device is arranged to focus the laser light to the core such that the laser light is received by the core within the first range of angles, and wherein the second optical device is arranged such that at least a part of the converted light is focused to the core or the inner cladding such that this part of the converted light is received by the core or the inner cladding at an angle which is bigger than a second boundary angle defined by the second numerical aperture.

10. The laser-based light source according to claim 5, wherein the first numerical aperture of the core is bigger than the second numerical aperture of the inner cladding.

11. The laser-based light source according to claim 1, wherein the laser-based light source comprises at least one controller arranged to receive detector signals from the detector, and wherein the at least one controller is arranged to provide control signals to control the at least one laser based on the received detector signals.

12. The laser-based light source according to claim 11, wherein the at least one controller being arranged to switch off the at least one laser if an intensity of the back guided converted light measured by the detector is below a predetermined threshold value.

13. The laser-based light source according to claim 5, wherein the inner cladding is further arranged such that laser light reflected at the first surface of the conversion device, but not the converted light, is absorbed in order to reduce the intensity of back guided reflected laser light received by the core or the inner cladding at bigger angles than the first boundary angle.

14. A vehicle headlight comprising at least one laser-based light source according to claim 1.

15. A lighting system comprising at least one vehicle headlight according to claim 14 and at least one light emission control device, wherein the light emission control device is adapted to submit control signals to the at least one vehicle headlight.

* * * * *